United States Patent
Lee et al.

(10) Patent No.: US 11,538,961 B2
(45) Date of Patent: Dec. 27, 2022

(54) LIGHT-EMITTING DIODE

(71) Applicants: Chung-Hwa Lee, New Taipei (TW); Jian-Ging Chen, Kaohsiung (TW)

(72) Inventors: Chung-Hwa Lee, New Taipei (TW); Jian-Ging Chen, Kaohsiung (TW)

( * ) Notice: Subject to any disclaimer, the term of this patent is extended or adjusted under 35 U.S.C. 154(b) by 127 days.

(21) Appl. No.: 16/879,801

(22) Filed: May 21, 2020

(65) Prior Publication Data

US 2020/0373458 A1    Nov. 26, 2020

(30) Foreign Application Priority Data

May 24, 2019 (TW) .................................. 108117953

(51) Int. Cl.
  *H01L 33/06* (2010.01)
(52) U.S. Cl.
  CPC .................................... *H01L 33/06* (2013.01)
(58) Field of Classification Search
  CPC ......... B82Y 20/00; B82Y 40/00; H01L 33/06; H01L 33/502; H02L 33/1501
  See application file for complete search history.

(56) References Cited

U.S. PATENT DOCUMENTS

| | | | |
|---|---|---|---|
| 9,030,108 B2* | 5/2015 | Deak, Sr. | H01L 25/048 315/186 |
| 2013/0293123 A1* | 11/2013 | Deak, Sr. | H05B 45/3578 315/186 |
| 2018/0019371 A1 | 1/2018 | Steckel et al. | |
| 2018/0083158 A1 | 3/2018 | Jang et al. | |
| 2018/0371313 A1* | 12/2018 | Aksit | C09K 11/883 |
| 2019/0189922 A1* | 6/2019 | Isojima | H01L 51/0587 |

FOREIGN PATENT DOCUMENTS

| | | |
|---|---|---|
| CN | 106159071 A | 11/2016 |
| KR | 20130103899 A | 9/2013 |

* cited by examiner

*Primary Examiner* — Nikolay K Yushin
(74) *Attorney, Agent, or Firm* — Bacon & Thomas, PLLC

(57) ABSTRACT

A light-emitting diode is disclosed, which includes: a substrate; a light-emitting diode chip disposed on the substrate; and a quantum dot film disposed on the light-emitting diode chip, wherein the quantum dot film includes a plurality of quantum dots and a matrix material, and a plurality of particles are dispersed in the matrix material, wherein the plurality of particles are conductive particles, semiconductor particles, or a combination thereof.

5 Claims, 1 Drawing Sheet

LIGHT-EMITTING DIODE

CROSS REFERENCE TO RELATED APPLICATION

This application claims the benefits of the Taiwan Patent Application Serial Number 108117953, filed on May 24, 2019, the subject matter of which is incorporated herein by reference.

BACKGROUND

1. Field

The present disclosure relates to a light-emitting diode and, more particularly, to a light-emitting diode using quantum dots.

2. Description of Related Art

When quantum dots (especially photoluminescent quantum dots) are irradiated by light, they will absorb photons, and then the electrons in its valence band will be excited to transit to the conduction hand. At the same time, holes (called "excitons") corresponding to the excited electrons will be generated in the valence band. The electrons in the conduction band can then jump back to the valence band in the form of radiation and recombine with the holes to emit photons. The foregoing describes the light-emitting process of the quantum dots.

However, when the strong light irradiates the quantum dots, an excessive number of electrons will be excited to transit to the conduction band. If the low energy state valence band is saturated with the electrons returning due to energy release, the excess electrons in the conduction band may be captured by the surface defect states of the quantum dots and quenched in a non-radiative form, or produce a series of electrochemical reactions with the external matter of the quantum dots, causing structural damage to the quantum dots. Although the quantum dots may be modified with ligands to reduce the surface defect states of the quantum dots in order to obtain better fluorescence, however, when there are too many electrons in the conduction band, the ligands are likely to fall off, making the structure of the quantum dots unstable.

In view of the above, there is an urgent need to develop a novel quantum dot light-emitting diode that can solve the aforementioned problems and provide an extended lifetime.

SUMMARY OF THE INVENTION

The present disclosure provides a light-emitting diode, which prolongs the lifetime of the quantum dot light-emitting diode by adjusting the composition of the quantum dot film.

The light-emitting diode of the present disclosure comprises: a substrate; a light-emitting diode chip disposed on the substrate; and a quantum dot film disposed on the light-emitting diode chip, wherein the quantum dot film includes a plurality of quantum dots and a matrix material, and a plurality of particles are dispersed in the matrix material, wherein the plurality of particles are conductive particles, semiconductor particles, or a combination thereof.

In the light-emitting process of quantum dots, the main procedure is to excite the quantum dots so that the electrons in the valence band of the quantum dots transit to the conduction band; and light will be generated when the electrons in the conduction band return to the valence band again. However, when the valence band is saturated with the returning electrons, the electrons in the conduction and may be captured by the surface defect states of the quantum dot, resulting in structural destruction of the quantum dots. Therefore, in the light-emitting diode of the present disclosure, by dispersing the conductive particles and/or semiconductor particles in the matrix material of the quantum dot film, it is possible to effectively discharge excess electrons in the conduction band through the conductive particles and/or semiconductor particles and reduce the capture of excess electrons in the conduction band by the surface defect states of the quantum dots, thereby increasing the lifetime of the quantum dot film.

In the light-emitting diode of the present disclosure, the quantum dots may be photoluminescent quantum dots. When the photoluminescent quantum dots are irradiated by light, they absorb photons, and the electrons in the valence bands thereof transit to the conduction band due to photo-excitation. Specific examples of the photoluminescent quantum dots include, but are not limited to, perovskite quantum dots, such as all-inorganic $CsPbX_3$ (X=Cl, Br; or I), organic-inorganic hybrid $CH_3NH_3PbX_3$ (X=Cl, Br; or I), or the like; core-shell quantum dots, such as CdSe/ZnS; and cadmium-free quantum dots, such as InP/ZnS, CuInS, nano-carbon quantum dots, nano-silicon quantum dots, or the like.

In the light-emitting diode of the present disclosure, the quantum dots may be ligand-modified quantum dots. By modifying the quantum dots with ligands, the quantum dots can exhibit better conductivity or dispersion. The ligand may be an organic ligand, a halogen ligand, a metal chalcogenide complex (MCC) ligand, or a combination thereof. Herein, the ligand may be selected according to the type of the quantum dot. Further, specific examples of the organic ligand include, but are not limited to, oleylamine, oleic acid, 1,3-benzenedithiol (1,3-BDT), 1,2-ethanedithiol (EDT), or mercaptopropionic acid (MPA); specific examples of the halogen ligand include, but are not limited to, $CH_3NH_3I$; and specific examples of the MCC ligand include, but are not limited to, $Sn_2S_6^{4-}$. However, the present disclosure is not limited thereto.

In the light-emitting diode of the present disclosure, the material of the conductive particles is not particularly limited as long as it has certain conductivity. For example, the material of the conductive particles may be a metal (e.g., iron, copper, aluminum, molybdenum, tungsten, gold, silver, chromium, nickel, platinum, or titanium), a metal alloy (e.g., an iron alloy, a copper alloy, an aluminum alloy, a molybdenum alloy, a tungsten alloy, a gold alloy, a silver alloy, a chromium alloy, a nickel alloy, a platinum alloy, or a titanium alloy), a transparent metal oxide (e.g., IGZO, AIZO, HIZO, ITZO, IGZTO, or IGTO), a conductive polymer (e.g., poly(3,4-ethylenedioxythiophene) (PEDOT), or a combination thereof; but the present disclosure is not limited thereto. In addition, the aforementioned materials of the conductive particles may be used alone or in combination.

In the light-emitting diode of the present disclosure, the structure of the conductive particles is not particularly limited, and may be designed according to the requirements. In an embodiment of the present disclosure, the conductive particles may be nano-particles or nano-wires. In another embodiment of the present disclosure, the conductive particles may have a single-layer structure or a multi-layer structure (e.g., a core-shell structure). However, the present disclosure is not limited thereto.

In the light-emitting diode of the present disclosure, the material of the semiconductor particles is not particularly limited. For example, the semiconductor particles may be made of an elemental semiconductor, a compound semiconductor, or a combination thereof. For example, the elemental semiconductor may be made of boron, diamond, germanium, silicon, gray tin, antimony, selenium, tellurium, or the like. The compound semiconductor may be a semiconductor material composed of two or more inorganic compounds, such as GaAs, ZnS, CdTe, HgTe, SiC or Ge—Si alloy, or the like; or the compound semiconductor may be an oxide semiconductor material formed of a metal element and oxygen, such as ZnO, CdO, $TiO_2$, $Al_2O_3$, SnO, $Cu_2O$, NiO, CoO, FeO, $Cr_2O_3$, BaO, $ZrO_2$, $Cu_2O$, $WO_3$, $In_2O_3$, or $Fe_3O_4$; but the present disclosure is not limited thereto. In addition, the aforementioned materials of the semiconductor particles may be used alone or in combination.

In the light-emitting diode of the present disclosure, the structure of the semiconductor particles is not particularly limited, and may be designed as needed. In an embodiment of the present disclosure, the semiconductor particles may be nano-particles or nano-wires. In another embodiment of the present disclosure, the semiconductor particles may have a single-layer structure or a multi-layer structure (e.g., a core-shell structure). However, the present disclosure is not limited thereto.

In the light-emitting diode of the present disclosure, the type of the matrix material is not particularly limited, as long as it can protect the quantum dots effectively or enable the effective dispersion of the conductive particles and/or the semiconductor particles. Herein, the matrix material may be an inorganic material, silica gel, a polymer material, or a combination thereof. Herein, specific examples of the inorganic material include, but are not limited to, $SiO_2$, $Al_2O_3$, ZnO, ZrO, $Y_2O_3$, $TiO_2$, CoO, $MnO_2$, NiO, CuO, PbO, $Si_3N_4$ and a combination thereof; and specific examples of the polymer material include, but are not limited to, epoxy, polymethyl methacrylate (PMMA), polycarbonate (PC), and a combination thereof. However, the present disclosure is not limited thereto.

In the light-emitting diode of the present disclosure, the effect of the substrate is mainly used to further release out the electrons discharged through the conductive particles and/or the semiconductor particles. Therefore, the substrate may be a substrate having certain conductivity, for example, a metal substrate or a semiconductor substrate. Examples of the metal substrate include, but are not limited to, an iron substrate, a copper substrate, an aluminum substrate, a molybdenum substrate, a tungsten substrate, a gold substrate, a chromium substrate, a nickel substrate, a platinum substrate, a titanium substrate, or an alloy substrate thereof; and examples of a semiconductor substrate include but are not limited to, a silicon substrate, an aluminum nitride substrate, or an aluminum oxide substrate. The aforementioned metal substrate and semiconductor substrate may be used alone or combined in the form of a composite substrate. If the substrate is a substrate without conductivity, more specifically an insulating substrate, the substrate needs to be provided with a circuit layer to further release out the electrons discharged through the conductive particles. Examples of the substrate without conductivity include, but are not limited to, a quartz substrate, a glass substrate, a silicon wafer substrate, a sapphire substrate, a polycarbonate (PC) substrate, a polyimide (PI) substrate, a polypropylene (PP) substrate, a polyethylene terephthalate (PET) substrate, or other substrates made of plastic or polymer materials. However, the present disclosure is not limited thereto.

DETAILED DESCRIPTION OF THE EMBODIMENT

The following embodiments when read with the accompanying drawings are made to clearly exhibit the abovementioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Moreover, the prepositions mentioned in the present specification and claims, such as "above", "over", "on", "below", "beneath", or "under", may refer to direct contact of two elements, or may refer to indirect contact of two elements.

In addition, the various features disclosed in different embodiments of the present disclosure may be combined to form another embodiment.

Example 1

Figure 1:
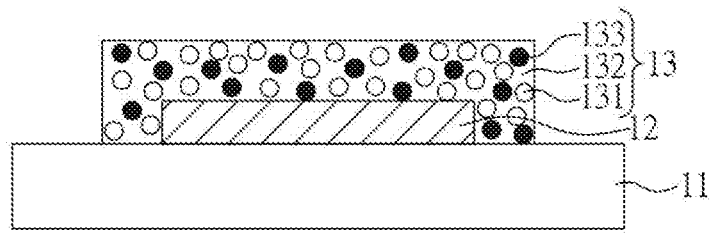
FIG. 1 is a schematic cross-sectional view showing a light-emitting diode according to Example 1 of the present disclosure.

FIG. 1 is a schematic cross-sectional view showing a light-emitting diode of the present example.

As shown in FIG. 1, first, a substrate 11 is provided. Thereafter, a light-emitting diode chip 12 is disposed on the substrate 11. Next, a quantum dot film 13 is formed on the light-emitting diode chip 12. The quantum dot film 13 may be formed on five surfaces of the light-emitting diode chip 12 except for the surface facing the substrate 11. However, the present disclosure is not limited thereto. In another embodiment of the present disclosure, the quantum dot film 13 may be formed only on the main light-emitting surface of the light-emitting diode chip 12, for example, on the surface of the light-emitting diode chip 12 opposite to the surface facing the substrate 11. In the present embodiment, the quantum dot film 13 includes a plurality of quantum dots 131 and a matrix material 132, and a plurality of particles 133 are dispersed in the matrix material 132. The particles 133 may be conductive particles, semiconductor particles, or a combination thereof.

Through the steps described above, a light-emitting diode of the present embodiment can be obtained and includes: a substrate 11; a light-emitting diode chip 12 disposed on the substrate 11; and a quantum dot film 13 disposed on the light-emitting diode chip 12, wherein the quantum dot film 13 includes a plurality of quantum dots 131 and a matrix material 132, and a plurality of particles 133 are dispersed in the matrix material 132, wherein the plurality of particles 133 may be conductive particles, semiconductor particles, or a combination thereof.

Herein, the substrate 11 is a metal substrate, a semiconductor substrate, or a substrate provided with a circuit layer. In the present embodiment, an aluminum substrate is used as the substrate 11. The light-emitting diode chip 12 may be a blue light chip with an epitaxial layer, a face-up LED chip, a vertical LED chip, or a flip-chip LED chip. In the present embodiment, the light-emitting diode chip 12 is a flip-chip LED chip. The quantum dots 131 are photoluminescent quantum dots, which may be perovskite quantum dots, such as all-inorganic $CsPbX_3$ (X=Cl, Br, or I), organic-inorganic hybrid $CH_3NH_3PbX_3$ (X=Cl, Br, or I), or the like; core-shell quantum dots, such as CdSe/ZnS; and cadmium-free quantum dots, such as InP/ZnS, CuInS, nano-carbon quantum dots, nano-silicon quantum dots, or the like. Also, the quantum dots 131 are ligand-modified photoluminescent quantum dots, and the ligand may be an organic ligand, a halogen ligand, a metal chalcogenide complex (MCC) ligand, or a combination thereof. In the present embodiment, the quantum dots 131 used are $CsPbBr_3$ perovskite quantum dots modified with oleylamine. In addition, the particles 133 may be conductive particles, which may be made of a metal, a metal alloy, a transparent metal oxide, a conductive polymer, or a combination thereof. Alternatively, the particles 133 may be semiconductor particles, which are made of an elemental semiconductor, a compound semiconductor, or a combination thereof. Moreover, no matter the conductive particles or the semiconductor particles are used, the particles 133 may be nano-particles or nano-wires. In the present embodiment, the particles 133 are nano-silver wires. Furthermore, the matrix material 132 may be an inorganic material, silica gel, a polymer material, or a combination thereof in the present embodiment, the matrix material 132 used is silica gel.

Example 2

Figure 2:
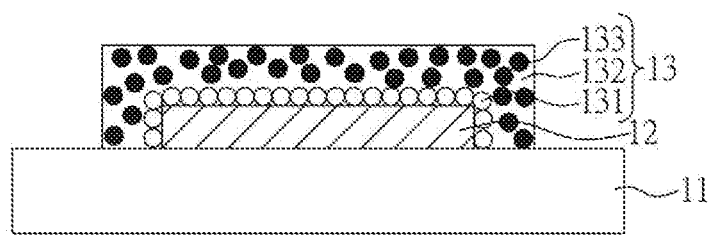
FIG. 2 is a schematic cross-sectional view showing a light-emitting diode according to Example 2 of the present disclosure.

FIG. 2 is a schematic cross-sectional view showing a light-emitting diode of the present example. The material, structure and preparation method of the light-emitting diode of the present example are similar to those of Example 1, except for the following differences.

Regarding the manufacturing method, as shown in FIG. 2, first, a substrate 11 is provided. Thereafter, a light-emitting diode chip 12 is disposed on the substrate 11. Next, a plurality of quantum dots 131 is formed on the surfaces of the light-emitting diode chip 12. In this example, the plurality of quantum dots 131 may be formed on five surfaces of the light-emitting diode chip 12 except for the surface facing the substrate 11. Afterwards, a matrix material 132 dispersed with the particles 133 is formed on the plurality of quantum dots 131. Through the foregoing steps, the light-emitting diode of this example is obtained.

In terms of structure, the quantum dot film 13 produced in this example includes the plurality of quantum dots 131 and the matrix material 132, and the particles 133 are dispersed in the matrix material 132. Specifically, the quantum dot film 13 includes a quantum dot layer formed of the plurality of quantum dots 131, and the matrix n material 132 dispersed with the particles 133.

Test Example

Figure 3:
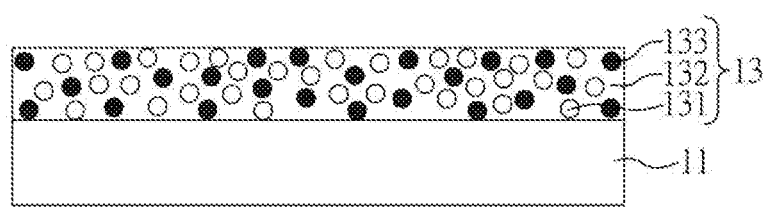
FIG. 3 is a schematic cross-sectional view of a test specimen used in Test Example of the present disclosure.

FIG. 3 is a schematic cross-sectional view of a test specimen used in Test Example.

In Test Example, the substrate 11 with the quantum dot film 13 formed thereon is used for testing. Herein, the quantum dot film 13 includes the plurality of quantum dots 131 and the matrix material 132, and the particles 133 are dispersed in the matrix material 132. In both the experimental and comparative examples of Test Example, the quantum dot films 13 uses the $CsPbBr_3$ perovskite quantum dots modified with oleylamine as the quantum dots 131; the matrix material 132 is silica gel; and the particles 133 are silver nanowires. In addition, the substrate 11 is an iron substrate in the experimental example but a plastic substrate in the comparative example.

The test method used in Test Example is carried out by irradiating the test specimen with strong blue light for eight hours. It is found that the quantum efficiency of the quantum dot film 13 under the use of the iron substrate as the substrate 11 is reduced by only 5%, while that under the use of the plastic substrate as the substrate 11 is reduced significantly by 70%.

As shown in the test described above, when the quantum dot film includes quantum dots and the matrix material dispersed with the particles the silver nanowires, used as the conductive particles herein), the excess electrons in the conduction band may be released out effectively by the conductive particles, and then further released out of the light-emitting diode through the substrate having certain conductivity. Thereby, the service life of the quantum dot film can be effectively extended, which further prolongs the lifetime of the quantum dot light-emitting diode.

Although the present disclosure has been explained in relation to its preferred embodiment, it is to be understood that many other possible modifications and variations can be made without departing from the spirit and scope of the disclosure as hereinafter claimed.

What is claimed is:

1. A light-emitting diode, comprising:
    a substrate;
    a light-emitting diode chip disposed on the substrate; and
    a quantum dot film disposed on the light-emitting diode chip, wherein the quantum dot film includes a plurality of quantum dots and a matrix material, and a plurality of particles are dispersed in the matrix material, wherein the plurality of particles are nano-wires made of a metal or a metal alloy.

2. The light-emitting diode of claim 1, wherein the plurality of quantum dots are photoluminescent quantum dots.

3. The light-emitting diode of claim 1, wherein the plurality of quantum dots are ligand-modified quantum dots.

4. The light-emitting diode of claim 1, wherein the matrix material is an inorganic material, silica gel, a polymer material, or a combination thereof.

5. The light-emitting diode of claim 1, wherein the substrate is a metal substrate, a semiconductor substrate, or a substrate provided with a circuit layer.

* * * * *